United States Patent [19]

Ashok et al.

[11] Patent Number: 4,960,752
[45] Date of Patent: Oct. 2, 1990

[54] PROCESS TO PRODUCE ORIENTED HIGH TEMPERATURE SUPERCONDUCTORS

[75] Inventors: Sankaranarayanan Ashok, Bethany; William G. Watson, Cheshire, both of Conn.

[73] Assignee: Olin Corporation, New Haven, Conn.

[21] Appl. No.: 315,864

[22] Filed: Feb. 27, 1989

[51] Int. Cl.[5] .......................................... H01L 39/12
[52] U.S. Cl. .......................................... 505/1; 164/46; 264/82; 264/121; 505/733; 505/780
[58] Field of Search ........................... 264/82, 85, 121; 505/739, 733, 741, 736, 784; 164/46

[56] References Cited

U.S. PATENT DOCUMENTS

| Re. 31,767 | 12/1984 | Brooks | 29/527.2 |
| 4,066,117 | 1/1978 | Clark et al. | 164/46 |
| 4,642,207 | 2/1987 | Uda et al. | 264/10 |
| 4,826,808 | 5/1989 | Yurek et al. | 505/1 |

OTHER PUBLICATIONS

"Superconductivity: A Revolution in Electricity is Taking Shape", *Chemical and Engineering News*, May 11, 1987, pp. 7–16 by Dagani.
"Bulk Superconductivity at 91K in Single-Phase Oxygen Deficient Perovskite $Ba_2YCu_3O_{9-\delta}$", *Physical Review Letters*, vol. 58, No. 16, Apr. 20, 1987, pp. 1676–1679, by Cava et al.
"Formation of Perovskite Surface Layers of Oxidation of Cu–La–Sr Alloy", *Journal of the Electrochemical Society*, vol. 134, No. 6, Jun. 6, 1987, pp. 1588–1589, by Gruen et al.
"Possible High $T_c$ Superconductivity in the Ba–La–Cu–O System", *Condensed Matter*, vol. 64, 1986, pp. 189–193, by Bedronz et al.
"Superconductor Mysteries Unravel as Developments Proceed", *American Ceramic Society Bulletin*, vol. 67, No. 4, 1988, pp. 725–735, by Fisher.
"Evidence for Anisotrophy Limitation on the Transport Critical–Current in Polycrystalline $Y,Ba_2Cu_3Ox$", *Journal of Applied Physics*, submitted Jun. 26, 1987, by Ekin et al.
"Preparation of Superconducting $YBa_2Cu_3Ox$ Thin Films by Oxygen Annealing of Multilayer Metal Films", *Applied Physics Letters*, vol. 51, No. 11, Sep. 14, 1987, pp. 858–860, by Tsaur et al.

*Primary Examiner*—James Lowe
*Assistant Examiner*—Christopher A. Fiorilla
*Attorney, Agent, or Firm*—Gregory S. Rosenblatt; Paul Weinstein

[57] ABSTRACT

A method to manufacture bulk polycrystalline superconducting materials having properties closely related to the properties of a single crystal of the superconducting material is provided. The method includes forming an oriented anisotropic structure by spray casting an atomized precursor onto a ceramic substrate. The precursor may be atomized in a neutral atmosphere and the resultant structure oxidized. In another embodiment, the precursor is atomized in an oxidizing atmosphere and the subsequent oxidation step may be omitted.

43 Claims, 2 Drawing Sheets

PROCESS TO PRODUCE ORIENTED HIGH TEMPERATURE SUPERCONDUCTORS

While the invention is subject to a wide range of applications, it particularly relates to a process for the manufacture of high temperature bulk superconducting structures. More particularly, the invention relates to the use of spray casting to form bulk superconductors having current carrying capabilities approaching that of a single crystal structure.

The recent discovery of a composition having superconductive properties at temperatures above the boiling point of liquid nitrogen has prompted great interest in the scientific community and dreams of low-cost medical imaging, faster computers and levitated trains. A material is considered superconductive if it conducts electricity with no resistance and excludes the flux lines of a magnetic field (the Meissner Effect). Ordinarily, materials which conduct electricity such as copper wires, resist the flow of electricity to some degree. Approximately 15% of the electricity passing through a copper wire is converted into heat and lost. Since superconductors have no resistance, the use of superconducting materials as a wire, an integrated circuit or a coil has the potential of revolutionizing the electrical and electronic industries, similar to the development of the light bulb and the transistor.

Superconductivity was first discovered in 1911 when a group of scientists found that mercury lost its electrical resistivity when cooled to 4° K. It is extremely expensive and impractical in commercial applications to maintain the superconductivity properties at such low temperatures. Over the years, researchers have discovered various new superconducting materials and gradually pushed up the transition temperature, known as the critical temperature, $T_c$, below which a material exhibits superconductive properties. An alloy of germanium-niobium ($Nb_3Ge$) was discovered to have superconductive properties below 23.3° K. Even at this transition temperature, liquid helium or liquid hydrogen is required to cool the alloy. Both of these liquids are expensive and difficult to handle.

In 1986, a breakthrough occurred when a composition of lanthanum-barium-copper-oxygen was found to have a transition temperature of about 35° K. The next goal of researchers was to find a compound with a transition temperature greater than the boiling point of liquid nitrogen, about 77.5° K. Liquid nitrogen is considerably safer to use and transport than liquid helium or hydrogen. Liquid nitrogen is substantially less expensive than the other cryogenic liquids and favors commercial exploitation.

A ceramic material, related to the class of minerals known as Perovskites, was found to have a transition temperature of about 90° K. This ceramic superconductor has the general composition $ZR_2Cu_3O_x$ where Z is one element selected from Group IIIB of the Chemical Periodic Table, R is one element selected from Group IIA of the Chemical Periodic table and x is an integer between 6.5 and 7.5. The metal oxide ceramic superconductors are oxygen deficient forms of perovskites with a layered structure not seen in naturally occurring minerals.

The structure consists of near-planar arrays of copper and oxygen atoms interspersed with layers of elements from Groups IIA and IIIB, such as barium and yttrium, respectively. The copper atoms exist in different valence states such as $Cu^{+2}$ and $Cuhu +1$. The number of oxygen atoms varies so that the total negative charge of the oxygen ions balances the total positive charge of the metal ions.

Many processes have been developed to manufacture the ceramic superconductors. One common method involves mixing $BaCO_3$, $Y_2O_3$, and $CuO$; sintering the mixture at a temperature in the range between 900° C. and 1100° C. in an oxidizing or fluoridizing atmosphere; and cooling the sintered mass to about 200° C. The cooling step is often followed by an anneal at a temperature in the range between 400° C. and 450° C. This method is more fully described "Superconductivity: A Revolution in Electricity is Taking Shape", *Chemical and Engineering News*, May 11, 1987, pages 7–16 by Dagani and "Bulk Superconductivity at 91K in single-Phase Oxygen-Deficient Perovskite $Ba_2YCu_3O_{9-\delta}$", *Physical Review Letters*, Volume 58, Number 16, (Apr. 20, 1987), pages 1676–1679 by Cava et al.

A second process for preparing the ceramic superconductor comprises mixing copper, lanthanum and strontium metals and melting the mixture under helium to form an alloy. The alloy is subsequently slowly heated in air to a temperature of 800° C. This method is exemplified in "Formation of Perovskite Surface Layers by Oxidation of Cu—La—Sr Alloys", *Journal of the Electrochemical Society*, Volume 134, Number 6, (June 1987), pages 1588–1589, by Gruen et al.

Yet another manufacturing process is disclosed in the article "Possible High $T_c$ Superconductivity in the Ba—La—Cu—O System", *Condensed Matter*, Volume 64, (1986), pages 189–193 by Bedronz et al. An aqueous solution of Ba—, La—, and Cu—nitrates is reacted with oxalic acid. The corresponding Ba—, La—, and Cu—oxalates precipitate from solution. The precipitate is decomposed in a solid state reaction by heating to 900° C. for 5 hours. The product is then pressed into pellets and sintered at 400° C.

While these processes all produce ceramic materials exhibiting superconductor characteristics, the current carrying capability of the bulk materials is significantly lower than the current carrying capability of a single crystal of the superconductor. For example, one study reported in "Superconductor Mysteries Unravel as Developments Proceed", *American Ceramic Society Bulletin*, Volume 67, Number 4, (1988), pages 725–735 by Fisher found the critical current which could pass through superconductor powders to be $10^4$–$10^5$ A/cm$^2$ while the bulk sintered samples had a critical current measured at 200–300 A/cm$^2$. A large portion of the decrease in current carrying capability was traced to poor interconnection between the superconducting grains and poor conductivity across grain boundaries.

Improved bulk properties were obtained using melt processing and oriented crystal growth. The critical current of a polycrystalline sample produced using such controlled processing was measured to be 7400 A/cm$^2$. Analysis of bulk polycrystalline material to determine what affected the critical current was reported in an article entitled "Evidence For Anisotropy Limitation on the Transport Critical-Current in Polycrystalline $Y_1Ba_2Cu_3O_x$," submitted to *Journal of Applied Physics*, June 26, 1987 by Ekin et al. The study determined that grain boundary resistivity was insufficient to produce the decrease in critical current detected in bulk superconductor materials. Electron micrographs also determined that impurities were not the source of the loss of current carrying capability.

The study concluded the inherent anisotropy of the superconducting properties of the $Y_1Ba_2Cu_3O_x$ crystal structure was a possible mechanism contributing to the low critical current in polycrystalline $Y_1Ba_2Cu_3O_x$ Electron transport along the Cu•O planes is believed to be the means of resistance free electrical conductivity in high temperature ceramic superconductors. Ekin et al. found the critical current carrying capability to be 500 times greater when measured parallel to the Cu•O plane than when measured perpendicular to the Cu•O plane. Aligning the Cu•O planes within a bulk polycrystalline ceramic superconductor will result in current carrying capabilities approaching that of the corresponding single crystal high temperature ceramic superconductor.

Ordered anisotropic superconductors have been formed by either oriented crystal growth or by epitaxial thin film growth. One method of producing a superconductor from thin films is detailed in an article entitled "Preparation of Superconducting $YBa_2Cu_3O_x$ Thin Films by Oxygen Annealing of Multilayer Metal Films", *Applied Physics Letters*, Volume 51 Number 11, (Sept. 14, 1987), pages 858–860, Tsauer et al. In this method, multiple layers of metal precursors are deposited on a single crystal sapphire or yttrium-stabilized cubic zirconium substrate by electron beam evaporation. The layers are subsequently oxidized by annealing in oxygen.

Both methods produce anisotropic layers of a ceramic superconductor. Neither is well suited for the manufacture of bulk superconducting materials. Oriented crystal growth is a slow process and thin film deposition is limited as to film thickness.

There is a metallurgical process referred to as spray casting. Broadly stated, spray casting comprises directing an atomized stream of molten metal or alloy onto a collecting surface to form a deposit. This technique has been used as a means to achieve more dense structures than are obtained by such conventional powder metallurgical techniques as using pressure and heat to sinter a powder into a compact. The process is disclosed in U.S. Pat. Nos. 3,909,921 (Reissue No. 31,767) and 4,066,117.

In accordance with the invention, a polycrystalline superconductor having oriented anisotropic properties is formed using spray casting techniques. The structure so formed is denser than conventionally produced sintered superconductors and current loss due to intergranular separation is reduced. The critical current of the bulk structure is increased due to the ordered orientation. The bulk superconductor may be formed more rapidly and to greater thickness than obtainable by conventional oriented crystal growth techniques. The structure formed by the process has a uniform density. The chemical composition of the superconductor may be readily controlled and incompatible precursors may be easily mixed.

Accordingly, there is provided a molten mixture of precursor elements in a desired stoichiometric ratio. A stream of the mixture is atomized to form a spray. The droplets are supercooled and collected on a substrate. The droplets solidify with the direction of crystal growth influenced by the orientation of the collecting surface. As a result, a dense, oriented anisotropic superconducting structure is formed.

The objects, features and advantages of the invention as described above as well as others will become more clear from the following drawings and specification.

Figure 1:
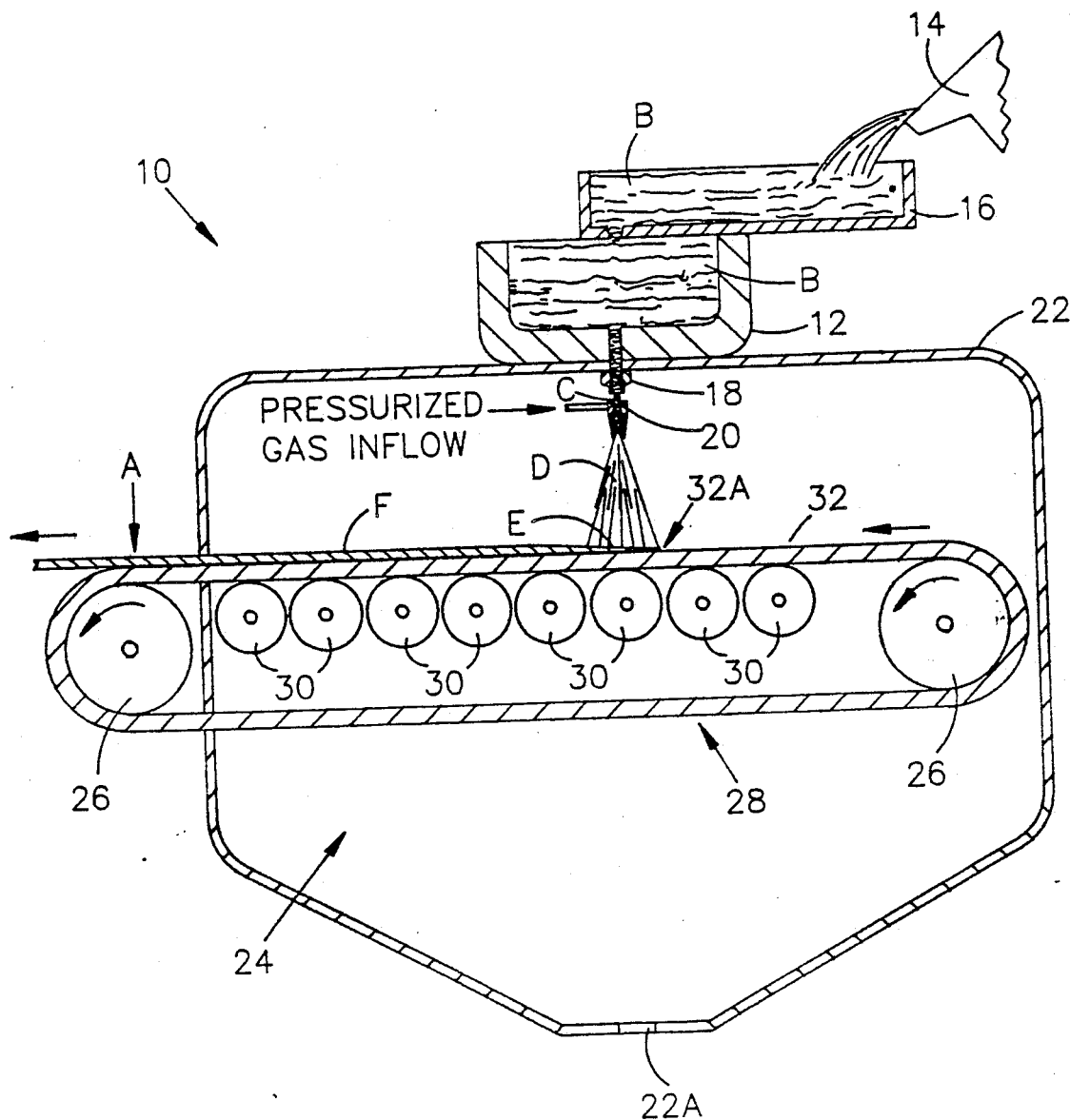
FIG. 1 is a schematic view, partly in cross-section, of a spray deposition apparatus for producing continuous strip of a high temperature superconductor.

FIG. 1 illustrates a spray deposition apparatus 10 as known in the art applied to the process of the invention for producing a polycrystalline high temperature superconductor having oriented anisotropic properties. The system as illustrated produces a continuous strip of product A. The manufacture of discrete articles is also obtainable by changing the collecting surface as will be discussed hereinbelow.

The spray deposition apparatus 10 employs a tundish 12 in which a mixture of precursors B is held in molten form. The tundish 12 receives the molten mixture B from a tiltable melt furnace 14, via a transfer launder 16. The tundish 12 further has a bottom nozzle 18 through which the molten mixture B issues in a continuous stream C. A gas atomizer 20 is positioned below the tundish bottom nozzle 18 within a spray chamber 22 of the apparatus 10.

The atomizer 20 is supplied with a gas, such as nitrogen, under pressure from any suitable source. The atomizer 20 surrounds the molten metal stream C and impinges the gas on the stream C so as to convert the stream into a spray D comprising a plurality of atomized molten droplets. The droplets are broadcast downward from the atomizer 20 in the form of a divergent conical pattern. If desired, more than one atomizer 20 may be used. Multiple atomizers are particularly suitable when the molten superconductor precursors are not miscible. The atomizer(s) 20 may be moved in a desired pattern for a more uniform distribution of the molten metal particles.

A continuous substrate system 24 as employed by the apparatus 10 extends into the spray chamber 22 in generally horizontal fashion and in spaced relation to the gas atomizer 20. The substrate system 24 includes a drive means comprising a pair of spaced rolls 26, an endless substrate 28 in the form of a flexible belt entrained about and extending between the spaced rolls 26 and a series of rollers 30 which underlie and support an upper run 32 of the endless substrate 28. An area 32A of the substrate upper run 32 directly underlies the divergent pattern of spray D for receiving thereon a deposit E of the atomized metal particles to form the metal strip product A.

Figure 2:
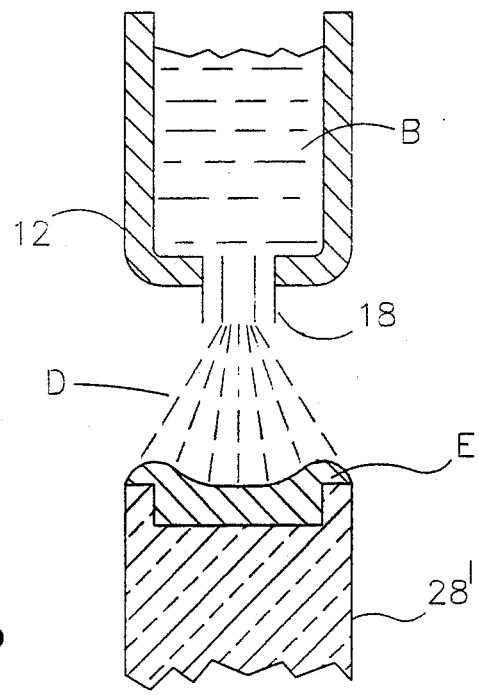
FIG. 2 is a schematic view, partly in cross-section, of a spray deposition apparatus for producing a discrete article from a high temperature superconductor.

For certain applications, it may be desirable to obtain the bulk high temperature superconductor in the form of a discrete article rather than a continuous strip. For these applications, the continuous substrate 28 is replaced with a collecting mold 28' as shown in FIG. 2. The system illustrated in FIG. 2 has been simplified by the removal of elements not required to differentiate FIG. 1. Elements performing similar functions to the elements of FIG. 1 have been designated with like reference numerals. The support elements of FIG. 1, such as furnace and spray chamber while not shown in FIG. 2 may be included in this embodiment and all other embodiments as well.

A divergent cone D of precursor droplets strikes the collecting mold 28'. The mold is shaped to form a desired article as disclosed in the above-cited U.S. Pat.

No. RE 31,767 which is incorporated herein by reference. Any desired shaped article may be formed by the selection of a properly shaped mold.

Referring back to FIG. 1, the atomizing gas flowing from the atomizer 20 is much cooler than the molten metal B in the stream C. Thus, the impingement of atomizing gas on the spray particles during flight and subsequently upon deposition on the substrate 28 (or 28' for a discrete article) extract heat therefrom, resulting in lowering the temperature of the metal deposit E below the solidus temperature of the metal B to form a solid strip F which is carried from the spray chamber 22 by the substrate 28 from which it is removed by a suitable mechanism (not shown). A fraction of the particles overspray the substrate 28 and fall to the bottom of the spray chamber 22 where the particles along with the atomizing gas flow from the chamber via an exhaust port 22A.

The invention will now be described using FIG. 1 for reference. The metallic superconductive precursors are placed in the furnace in the proper stoichiometric ratio. For the purpose of this application, the term "superconductor precursor" or "precursor" refers to a mixture of elements or compounds which when combined in the proper ratio and subjected to a desired process forms a high temperature superconductor. The term "stoichiometric ratio" relates to supplying the precursor elements in the proper molar concentration to form the desired chemical concentration.

For the $YBa_2Cu_3O_x$ type ceramic superconductor, yttrium, barium and copper are placed in the crucible and heated to a temperature of about 1900° C. to form a molten mixture. The mixture need not be made from the elements. Compounds such as CuO, $Y_2O_3$ and BaO may be used. Likewise, the $YBa_2Cu_3O_{6.5-7.5}$ compound may be placed in the crucible and melted.

Yttrium, barium and copper are miscible and the molten mixture may be readily formed. Other superconducting systems may not be comprised of readily combinable elements. When the precursors are incompatible, the melt may be stirred by a means known in the art, such as electromagnetic stirring or multiple crucibles and nozzles may be employed.

Figure 3:
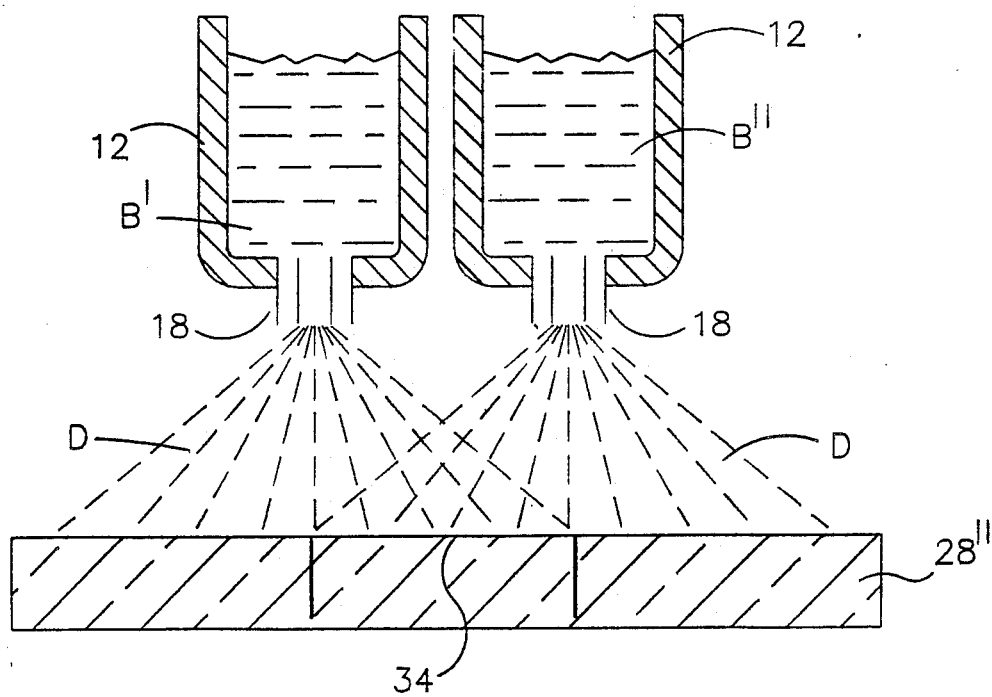
FIG. 3 is a schematic view, partly in cross-section, of a spray deposition apparatus for producing a high temperature superconductor from incompatible precursors.

Stirring is impractical for some superconductor formulations due to chemical interaction between the molten components. Also, one component may vaporize at a temperature less than the temperature required to melt a second component. When the precursors are incompatible, the embodiment shown in FIG. 3 comprising a plurality of atomizing nozzles 18 is employed.

Each tundish 12 contains a molten element, compound or mixture B such the combination of contents comprises a mixture having a desired stoichiometric ratio of superconductor precursors. The atomizing nozzles 18 are spaced in close proximity and form a plurality of overlapping divergent cones D of droplets. The interaction between the semisolid droplets is less than the interaction between the molten metals. The droplets are supercooled and readily solidify upon impact with the substrate forming the desired composition.

Referring back to the example of the $YBa_2Cu_3O_x$ system and using FIG. 1 for reference, about 17 molar % yttrium, about 34 molar % barium and about 49 molar % copper are melted in the tilt furnace 14. The melt is poured into the transfer lauder 16 and transferred to the tundish 12. The liquid metal stream C passes through the atomizer 20 where the atomizing gas impinges the stream forming a divergent cone of oxygen deficient $YBa_2Cu_3$ precursor droplets. The atmosphere of the spray chamber 22 may be either neutral, such as argon or nitrogen, or oxidizing such as air or a nitrogen/oxygen mixture. If the atmosphere of the spray chamber is neutral, the formed strip must be subsequently oxidized as described hereinbelow to achieve the superconducting state. If the atmosphere is oxidizing, the droplets form the oxidized superconducting material $YBa_2Cu_3O_x$. Preferred atmospheres are oxidizing.

The droplets cool while passing through the chamber 22 and are preferably in a supercooled plastic state at impact. Upon impact with the substrate, the droplets splat, or flatten out. The supercooled state is metastable and solidification occurs rapidly.

The composition of the substrate affects both the grain orientation and the current carrying capability of the bulk superconductor. The substrate composition should preferably meet three requirements. The substrate composition is selected to restrict diffusion of substrate components into the deposit E. The substrate composition is further selected to orient the crystal growth of the strip A. The substrate composition is still further selected to facilitate removal of the strip A from the substrate 32.

The superconducting properties of the bulk superconductor resides in the ordered crystalline structure. Charge carriers travel along nearly planar Cu•O crystal planes. In the above referenced article by Fisher, it is noted that the substitution of 0.025 atomic % nickel for copper in the $La_{2-x}SrCuO_4$ system reduces the superconducting transition temperature from 40° K. to 22° K. A nondiffusing substrate such as a ceramic is desirable. Aluminum oxide and magnesium oxide are preferred substrate materials.

Secondly, the substrate should promote the oriented crystal growth of the solidifying droplets. Oriented growth occurs naturally during the solidification of the splats. Epitaxial growth in the bulk superconductor may be enhanced by using a substrate having low thermal conductivity. The ordered growth may be further enhanced by providing a substrate having an oriented crystal structure on the surface of the substrate adapted to collect the droplets.

Finally, the formed structure should not adhere to the substrate. While the selection of a non-diffusing substrate satisfies this requirement to a certain extent, the substrate should further have the properties of a high melting temperature and low reactivity. Preferred substrates are comprised of a ceramic such as aluminum oxide, magnesium oxide and strontium titanate.

Bulk materials having an oriented grain structure in thickness of up to about ½ inch may be produced by this process. The thickness of the bulk material may be controlled in several ways. The belt speed may be controlled or the solidified metal may be run under the spray nozzle several times. As long as the surface of the metal has an oriented grain structure and the droplets strike the surface when the droplets are in the supercooled state so that a splat followed by rapid solidification occurs, the oriented pattern will be continued.

Once the desired precursor alloy is formed to the desired thickness, if the alloy is oxygen deficient, oxidation is required. Annealing in air is a preferred means of achieving the superconducting composition. The oxygen deficient alloy is heated in air or other oxidizing atmosphere to a temperature in excess of about 800° C. and more preferably to a temperature of from about 900° C. to about 1100° C. The anneal time is that required to achieve solid state diffusion of the oxygen through the bulk sample. Solid state diffusion in the $YBa_2Cu_3$ system is quite rapid and anneal times of from about 1 hour to about 36 hours are acceptable. More preferably, the oxygen anneal time is from about 6 hours to about 24 hours.

Following the oxygen anneal, a gradual cooling is required to retain the desired ordered crystal structure. A cool down rate of from about 1° C. to about 20° C. per minute is acceptable. A preferred cool down rate is from about 1° C. to about 2° C. per minute. The controlled cooling step may be accomplished in air or in any other non-reducing atmosphere.

Of course, if the spray chamber atmosphere was originally oxidizing as in one of the preferred embodiments described hereinabove, the droplets are already oxidized and the subsequent oxygen anneal is not required.

The patents and publications set forth in the specification are incorporated by reference herein.

It is apparent that there has been provided in accordance with this invention a process to produce bulk superconducting structures having current carrying capabilities similar to that of the single crystal structure which fully satisfy the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications and variations which fall within the broad scope of the appended claims.

We claim:

1. A method for manufacturing a polycrystalline superconductor having oriented anisotropic properties from an oxygen deficient precursor having a desired stoichiometric composition, comprising the steps of:
   (a). atomizing said precursor into supercooled droplets and directing said atomized precursor onto a ceramic substrate;
   (b). solidifying said droplets on said ceramic substrate, such that the droplets flatten out upon impact and oriented crystal growth occurs;
   (c). removing said structure from said ceramic substrate; and
   (d). oxidizing said structure to form a polycrystalline superconductor having oriented anisotropic properties.

2. The method of claim 1 wherein said precursor is supplied in the form of a molten stream.

3. The method of claim 2 wherein said stream is atomized in a neutral atmosphere and said method includes the step of subsequently oxidizing said structure.

4. The method of claim 3 wherein said neutral atmosphere is nitrogen.

5. The method of claim 1 wherein said substrate is selected from the group consisting of aluminium oxide, magnesium oxide and strontium titanate.

6. The method of claim 5 wherein said substrate is aluminum oxide.

7. The method of claim 5 wherein said substrate has an oriented crystalline structure on a surface adapted to receive said droplets.

8. The method of claim 3 wherein said oxidation step comprises:
   (a). heating said structure to a temperature in excess of about 800° C. for a time of from about 1 hour to about 36 hours in an oxidizing atmosphere; and
   (b). gradually cooling said structure at a rate of from about 1° C. per minute to about 20° C. per minute.

9. The method of claim 8 wherein said oxidizing atmosphere is air.

10. The method of claim 8 wherein said structure is heated to a temperature of from about 900° C. to about 1100° C.

11. The method of claim 10 wherein said structure is held at a temperature of from about 900° C. to about 1100° C. for a time of from about 6 hours to about 24 hours.

12. The method of claim 10 wherein said gradually cooling rate is from about 1° C. per minute to about 2° C. per minute.

13. The method of claim 8 wherein said substrate is a flexible belt.

14. The method of claim 8 wherein said substrate is a collecting mold.

15. The method of claim of claim 10 wherein said precursor comprises a mixture of yttrium, barium and copper or compounds thereof.

16. The method of claim 1 wherein said precursor is supplied in the form of a plurality of molten streams, each said stream atomized to droplets such that the combination of droplets has a desired stoichiometric ratio.

17. The method of claim 16 wherein said streams are atomized in a neutral atmosphere and said method includes the step of subsequently oxidizing said structure.

18. The method of claim 17 wherein said neutral atmosphere is nitrogen.

19. The method of claim 17 wherein said substrate is selected from the group consisting aluminum oxide, magnesium oxide and strontium titanate.

20. The method of claim 19 wherein said substrate is aluminum oxide.

21. The method of claim 19 wherein said substrate has an orient crystalline structure on a surface adapted to receive said droplets.

22. The method of claim 17 wherein said oxidation step comprises:
   (a). heating said structure to a temperature of in excess of about 800° C. for a time of from about 1 hour to about 36 hours in an oxidizing atmosphere; and
   (b). gradually cooling said structure at a rate of from about 1° C. per minute to about 20° C. per minute.

23. The method of claim 22 wherein said oxidizing atmosphere is air.

24. The method of claim 22 wherein said structure is heated to a temperature of from about 900° C. to about 1100° C.

25. The method of claim 24 wherein said structure is held at a temperature of from about 900° C. to about 1100° C. for a time of from about 6 hours to about 24 hours.

26. The method of claim 24 wherein said gradual cooling rate is from about 1° C. per minute to about 2° C. per minute.

27. The method of claim 22 wherein said substrate is a flexible belt.

28. The method of claim 17 wherein said substrate is a collecting mold.

29. The method of claim 3 wherein said stream is atomized in an oxidizing atmosphere.

30. The method of claim 29 wherein said oxidizing atmosphere is air.

31. The method of claim 29 wherein said substrate comprises ceramic.

32. The method of claim 31 wherein said substrate is selected from the group consisting of aluminum oxide, magnesium oxide and strontium titanate.

33. The method of claim 32 wherein said substrate is aluminum oxide.

34. The method of claim 32 wherein said substrate has an oriented crystalline structure on a surface adapted to receive said droplets.

35. The method of claim 32 wherein said substrate is a flexible belt.

36. The method of claim 32 wherein said substrate is a collecting mold.

37. The method of claim 16 wherein said streams are atomized in an oxidizing atmosphere.

38. The method of claim 37 wherein said oxidizing atmosphere is air.

39. The method of claim 37 wherein said substrate is selected from the group consisting of aluminum oxide, magnesium oxide and strontium titanate.

40. The method of claim 39 wherein said substrate is aluminum oxide.

41. The method of claim 39 wherein said substrate has an oriented crystalline structure on a surface adapted to receive said droplets.

42. The method of claim 39 wherein said substrate is a flexible belt.

43. The method of claim 39 wherein said substrate is a collecting mold.

* * * * *